US012696796B2

(12) United States Patent
Xia et al.

(10) Patent No.: US 12,696,796 B2
(45) Date of Patent: Jul. 28, 2026

(54) CHIP PACKAGE HAVING A STIFFENER AND AN ELECTRONIC DEVICE HAVING THE SAME

(71) Applicants: Advanced Micro Devices, Inc., Santa Clara, CA (US); ATI Technologies ULC, Thornhill (CA)

(72) Inventors: Zean Xia, Shanghai (CN); Jian Guo Li, Thornhill (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 452 days.

(21) Appl. No.: 18/196,954

(22) Filed: May 12, 2023

(65) Prior Publication Data
US 2024/0379476 A1     Nov. 14, 2024

(51) Int. Cl.
| | |
|---|---|
| *H10W 76/40* | (2026.01) |
| *H10P 95/00* | (2026.01) |
| *H10W 74/15* | (2026.01) |
| *H10W 90/00* | (2026.01) |

(52) U.S. Cl.
CPC ............. *H10W 76/40* (2026.01); *H10P 95/00* (2026.01); *H10W 90/00* (2026.01); *H10W 90/701* (2026.01); *H10W 74/15* (2026.01); *H10W 90/724* (2026.01); *H10W 90/734* (2026.01)

(58) Field of Classification Search
CPC . H01L 23/16; H01L 21/321; H01L 23/49816; H01L 23/562
See application file for complete search history.

(56) References Cited

U.S. PATENT DOCUMENTS

| | | | |
|---|---|---|---|
| 10,840,192 B1 * | 11/2020 | Zohni ................. | H01L 21/4817 |
| 2015/0077918 A1 * | 3/2015 | Zhang .................... | H01L 25/50 |
| | | | 361/679.02 |
| 2022/0208624 A1 * | 6/2022 | Kwon ..................... | H01L 23/16 |
| 2023/0046098 A1 * | 2/2023 | Kim ....................... | H01L 23/562 |
| 2024/0297087 A1 * | 9/2024 | Chang ................... | H01L 21/568 |

* cited by examiner

*Primary Examiner* — Tracie Y Green
(74) *Attorney, Agent, or Firm* — Patterson + Sheridan, LLP

(57) ABSTRACT

An electronic device includes a package substrate having a top surface and a bottom surface. An integrated circuit ("IC") die is disposed on the top surface of the package substrate. The electronic device also includes a stiffener having a ring body and a plurality of support members. The ring body is secured to the top surface of the package substrate and circumscribes the IC die. The plurality of support members extend from the ring body to below the bottom surface of the package substrate.

17 Claims, 5 Drawing Sheets

136

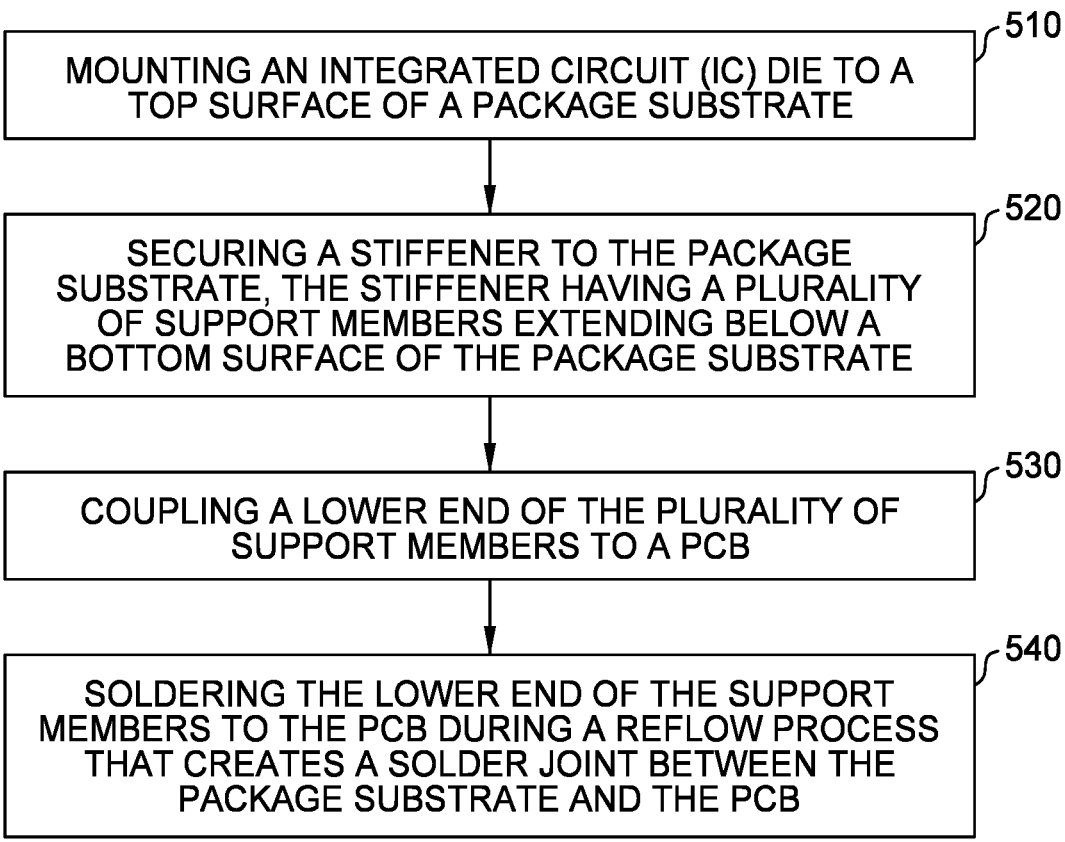

510

MOUNTING AN INTEGRATED CIRCUIT (IC) DIE TO A TOP SURFACE OF A PACKAGE SUBSTRATE

520

SECURING A STIFFENER TO THE PACKAGE SUBSTRATE, THE STIFFENER HAVING A PLURALITY OF SUPPORT MEMBERS EXTENDING BELOW A BOTTOM SURFACE OF THE PACKAGE SUBSTRATE

530

COUPLING A LOWER END OF THE PLURALITY OF SUPPORT MEMBERS TO A PCB

540

SOLDERING THE LOWER END OF THE SUPPORT MEMBERS TO THE PCB DURING A REFLOW PROCESS THAT CREATES A SOLDER JOINT BETWEEN THE PACKAGE SUBSTRATE AND THE PCB

FIG. 5

CHIP PACKAGE HAVING A STIFFENER AND AN ELECTRONIC DEVICE HAVING THE SAME

TECHNICAL FIELD

Embodiments of the present invention generally relate to chip packages having a stiffener for controlling deformation, and electronic devices having the same.

BACKGROUND

Electronic devices, including photonic devices, micro-electromechanical systems (MEMS) and/or RF devices, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit ("IC") dies to be mounted to a single package substrate. The IC dies may include memory, logic or other IC devices. These micro devices containing one or more chip packages are frequently utilized in advanced electronic computing systems, such as found in telecomm and datacomm equipment, cellular antennas, data centers and automotive electronics, among others.

Out of plane warpage of the chip package can be problematic to conventional chip packaging schemes. Conventional substrates tend to warp due to material strength caused by thickness and mismatches in coefficients of thermal expansion for the chip, underfill, and substrate. Additionally, the trend toward large chip package sizes increases the potential for warpage. For example, some packages may experience solder joint bridging around the package corners due warpage during reflow processing.

There is a need, therefore, for an improved chip package, and in particular, to a chip package having an improved stiffener and electronic devices having the same.

SUMMARY

In one example, an electronic device includes a package substrate having a top surface and a bottom surface. An integrated circuit ("IC") die is disposed on the top surface of the package substrate. The electronic device also includes a stiffener having a ring body and a plurality of support members. The ring body is secured to the top surface of the package substrate and circumscribes the IC die. The plurality of support members extend from the ring body to below the bottom surface of the package substrate.

In another example, an electronic device includes a package substrate having a top surface and a bottom surface. An integrated circuit ("IC") die is disposed on the top surface of the package substrate. A stiffener is secured to the top surface of the package substrate and circumscribes the IC die. The stiffener has a plurality of support members extending below the bottom surface of the package substrate. A printed circuit board ("PCB") is connected to the package substrate. The plurality of support members are configured to provide constant spacing between the package substrate and the PCB.

In another example, a method of fabricating an electronic device includes mounting an integrated circuit (IC) die to a top surface of a package substrate. A stiffener securing to the top surface of the package substrate. The stiffener includes a plurality of support members extending below a bottom surface of the package substrate. A lower end of the plurality of support members is coupled to a PCB. Thereafter, the lower end of the support members is soldered to the PCB during a reflow process that creates a solder joint between the package substrate and the PCB.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 illustrates a flow diagram for fabricating an electronic device, according to some embodiments.

Figure 1:
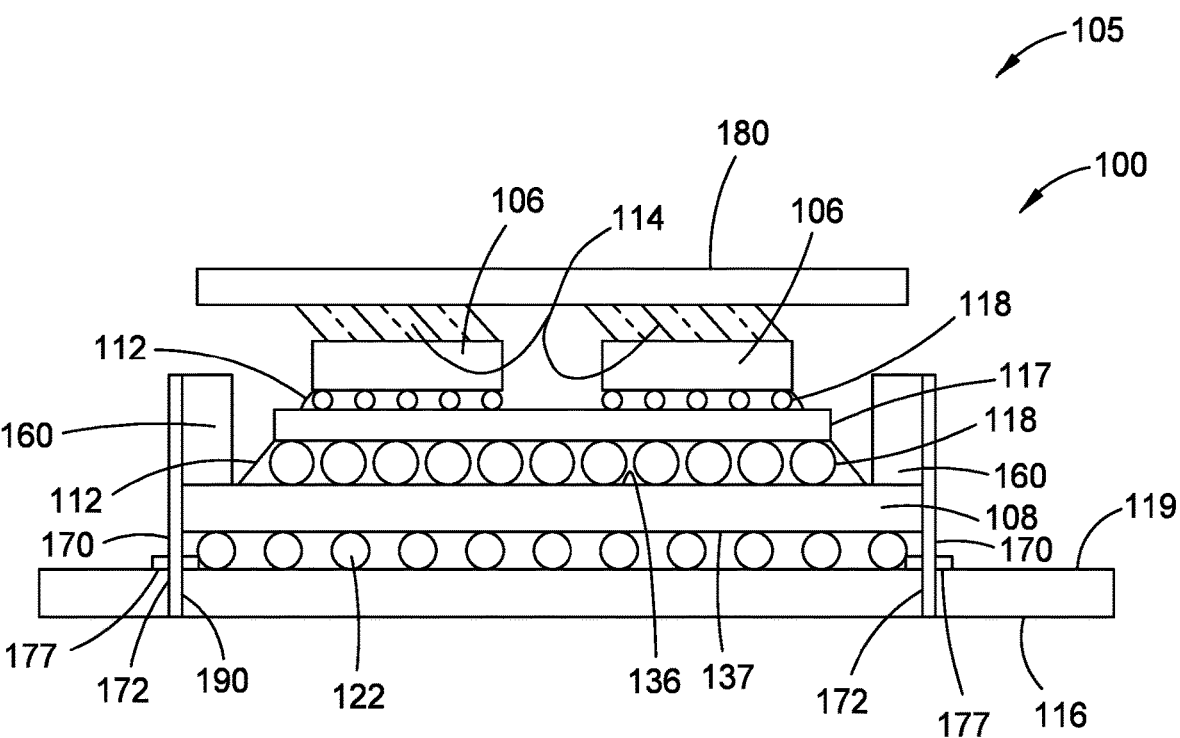
FIG. 1 is a schematic side view of an electronic device having a chip package mounted to a printed circuit board, according to some embodiments.

To facilitate understanding, identical reference numerals have been used, where possible, to designate identical elements that are common to the figures. It is contemplated that elements of one embodiment may be beneficially incorporated in other embodiments. Additionally, the adjectives top and bottom are provided for ease of explanation, and may be utilized to desired surfaces that alternatively may have a vertical orientation.

DETAILED DESCRIPTION

An electronic device having a package substrate and an integrated circuit die disposed on the package substrate is provided. A stiffener is disposed on the package substrate and circumscribes the IC die. The stiffener includes a plurality of support members extending below the package substrate. The plurality of support members advantageously provide constant spacing between the package substrate and the printed circuit board.

FIG. 1 is a schematic side view of an electronic device 105 having a chip package 100 mounted to a printed circuit board ("PCB") 116, according to some embodiments. The chip package 100 includes one or more integrated circuit ("IC") dies 106 and a package substrate 108. In this example, two IC dies 106 are electrically and mechanically mounted to the top surface 136 of the package substrate 108. The IC dies 106 may be electrically and mechanically mounted to an optional interposer 117, with the interposer 117 electrically and mechanically mounted to the package substrate 108. The package substrate 108 of the chip package 100 is mounted to the PCB 116 to form at least a portion of the electronic device 105. The chip package 100 may include any suitable number of IC dies 106 that may fit on the PCB 116, such as three, six, or nine IC dies. Examples of IC dies 106 that may be utilized in the chip package 100 include, but are not limited to, logic and memory devices, such as field programmable gate arrays (FPGA), application-specific integrated circuits (ASICs), memory devices, such as high band-width memory (HBM), optical devices, processors or other IC logic or memory structures. One or more of the IC dies 106 may optionally include optical devices such as photodetectors, lasers, optical sources, and the like.

Functional circuitry of the IC dies 106 is connected to the circuitry of the package substrate 108 through the solder connections 118 or other suitable electrical connection, such as a hybrid connecter comprised of metal circuit connection material disposed in a dielectric sheet. When used, the interposer 117 may be connected to the package substrate 108 via solder connections 118 between the interposer 117 and the package substrate 108. A bottom surface 137 of the package substrate 108 is electrically and mechanically coupled to the circuitry of the PCB 116 via solder joints 122 when the chip package 100 is mounted to a top surface 119 of the PCB 116 to form the electronic device 105.

Dielectric filler 112 is disposed on the interposer 117 and at least partially laterally circumscribes the dies 106. The dielectric filler 112 may also encapsulate the dies 106 against the interposer 117. The dielectric filler 112 is also disposed between the interposer 117 and the package substrate 108. The dielectric filler 112 provides additional rigidity to the chip package 100, while also protecting the solder connections 118 between the IC dies 106 and the interposer 117 and between the interposer 117 and the package substrate 108. The dielectric filler 112 may be an epoxy-based material or other suitable material. The dielectric filler 112 may additionally include fillers, for example, inorganic fillers such as silica ($SiO_2$).

A stiffener 160 is coupled to the package substrate 108 and circumscribes the IC dies 106. The stiffener 160 can extend to peripheral edges of the package substrate 108 to provide mechanical support, which helps prevent the chip package 100 from warpage. In some embodiments, the stiffener 160 includes a plurality of support members 170 extending below the stiffener 160 and engaged with the PCB 116, as will described in more detail below. The stiffener 160 may be a single-layer structure or a multi-layer structure. The stiffener 160 may be made of ceramic, metal, or other various inorganic materials, such as aluminum oxide ($Al_2O_3$), aluminum nitride (AlN), silicon nitride (SiN), silicon (Si), copper (Cu), aluminum (Al), diamond, and stainless steel, among other materials. The stiffener 160 can also be made of organic materials such as copper-clad laminate. In some embodiments, the stiffener 160 is secured to the package substrate 108 using an adhesive, such as an epoxy.

A lid 180 may be disposed over the IC dies 106. In some examples, the lid 180 may be fabricated from a thermally conductive material, such as copper, nickel-plated copper, or aluminum, among other suitable materials. In this respect, the lid 180 functions as a thermal management device. In some embodiments, the lid 180 may include diamonds, such as on a bottom surface of the lid 180. The lid 180 may have a thickness of between about 0.5 mm and about 3.0 mm, although other thicknesses may be utilized. Additional thermal management devices, either active or passive, may optionally be mounted to the top surface of the lid 180.

Generally, the lid 180 is disposed over the IC dies 106. A thermal interface material (TIM) 114 may be utilized to thermally and/or mechanically couple the lid 180 to the IC dies 106. The TIM 114 may be selected to provide a thermally conductive path between the lid 180 and the IC dies 106 so that heat generated by the IC dies 106 may be dissipated through the lid 180. The TIM 114 is generally a heat transfer material having a conductivity of at least about 0.1 W/m·K and is designed to displace the air that is present in the gaps between the lid 180 and the IC dies 106, thereby decreasing the thermal contact resistance. Examples of materials suitable for use as the TIM 114 include thermal grease, thermally conductive epoxy, phase-change materials (PCMs), conductive tapes, and silicone-coated fabrics among other suitable materials. The TIM 114 may be a soft or compliant adhesive to allow compensation between mismatched heights of neighboring IC dies 106 within the chip package 100. In one example, the TIM 114 may be a thermal gel or thermal epoxy, such as packaging component attach adhesives available from Al Technology, Inc., located in Princeton Junction, New Jersey. The PCM may be manufactured as a blend of hydrocarbon polymers to provide a material that has slight melting, but is mostly an amorphous solid that softens with temperature and does not suddenly change from a solid to a liquid state. One or more of these polymers may contain metal powder and/or ceramic fillers, which may be greater than 90% of the PCM by weight. The fillers may have a maximum particle size of 25 μm. In another example, the TIM 114 may be a phase-change material, such as Tpcm 780 or Tpcm 780SP available from Laird PLC of London, United Kingdom.

Optionally, the bottom surface of the lid 180 may include a patterned surface. The patterned surface may be comprised of dimples, projections, blind holes, slots, channels and the like which increase the surface area of the bottom surface in contact with the TIM 114, which increases the heat transfer efficiency. The patterned surface, in one example, is comprised of a pattern of micro-grooves formed in the bottom surface of the lid 180. The patterned surface may be formed via etching, embossing, or any other suitable technique. For some examples, the patterned surface may be in the form of micro-grooves arranged rows, in columns, as positive-sloping diagonals, as negative-sloping diagonals, or as a combination thereof. In one example, the features (i.e., micro-grooves, protrusions, etc.) forming the patterned surface may have a plus or minus elevation of, but not limited to, 0.1 mm to 0.2 mm relative to the general plane of the bottom surface.

In some embodiments, the lid 180 is disposed over the stiffener 160. In some implementations, the lid 180 may be bonded to the stiffener 160 by an adhesive (not shown), such as an epoxy. In other implementations, the lid 180 is movably coupled to the stiffener 160. For example, the lid 180 may include a pin that can be inserted into a hole in the stiffener 160. The pin coupling allows the lid 180 to move freely (i.e., "float") relative to the stiffener 160. In this manner, stresses between the lid 180 and the stiffener 160 are mechanically decoupled, resulting in less warpage and delamination of the various layers and components of the chip package 100.

Figure 2:
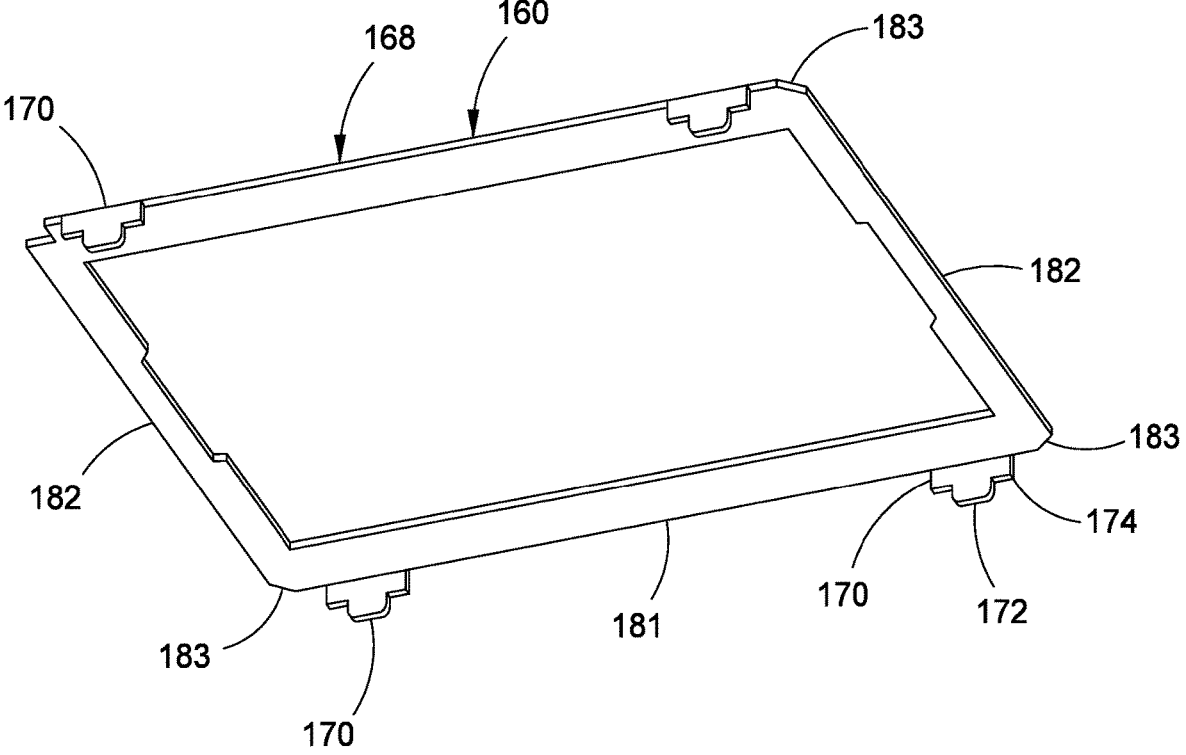
FIG. 2 is a bottom perspective view of the stiffener of FIG. 1, according to some embodiments.
Figure 3:
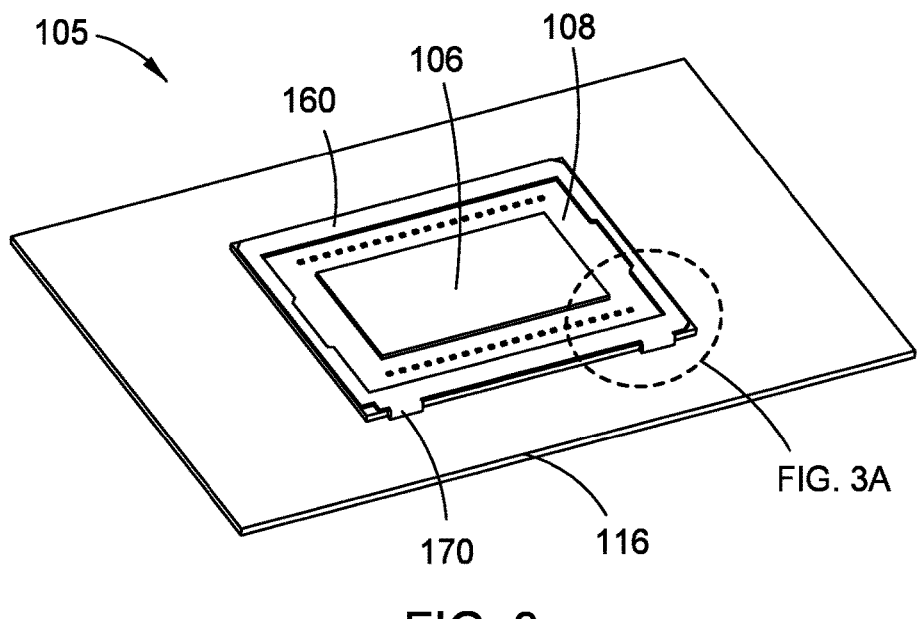
FIG. 3 is a top isometric view of the electronic device of FIG. 1 shown with the lid removed.
Figure 3A:
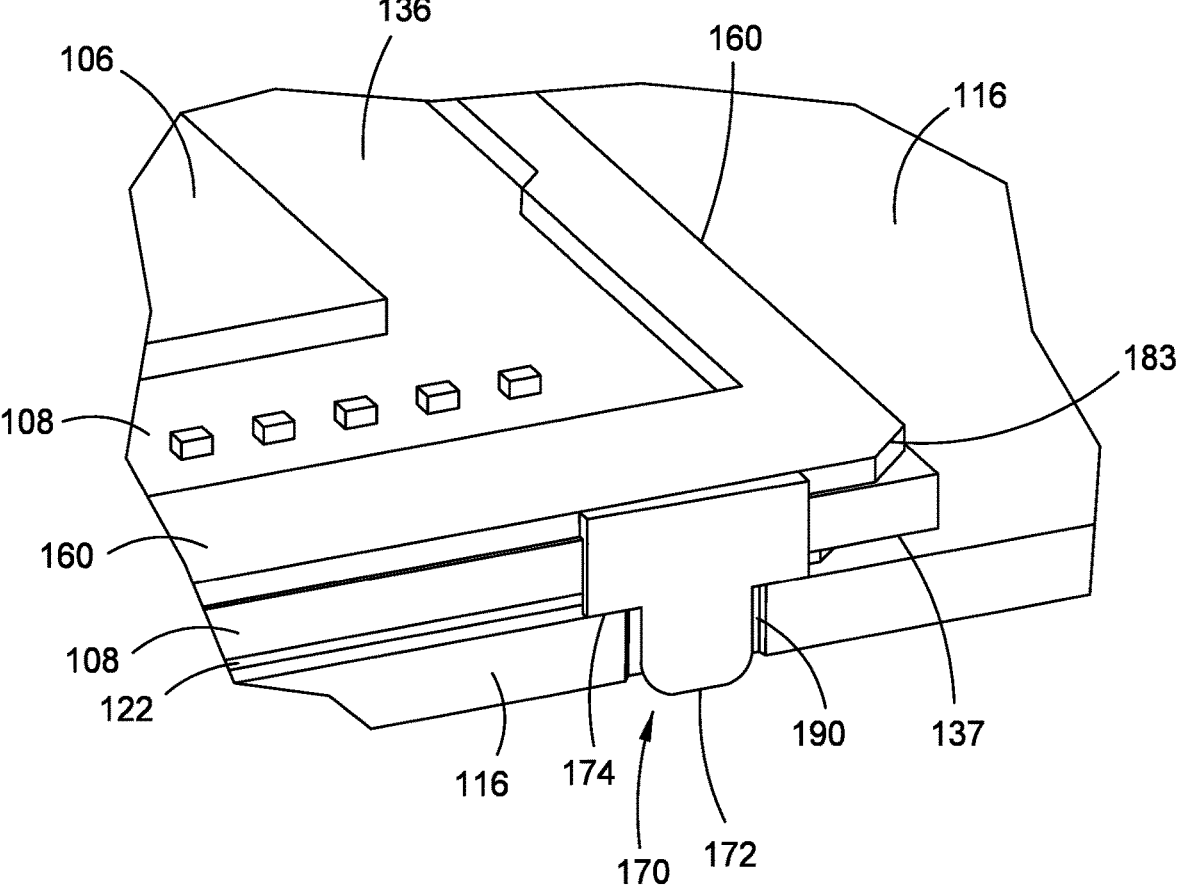
FIG. 3A is an enlarged partial cut-away view of a portion of the electronic device depicted in FIG. 3.

FIG. 2 is a bottom perspective view of the stiffener 160 of FIG. 1, according to some embodiments. FIG. 3 is a top isometric view of the electronic device 105 of FIG. 1 shown with the lid 180 removed. FIG. 3A is an enlarged partial cut-away view of a portion of the electronic device 105 depicted in FIG. 3. In this embodiment, the stiffener 160 is a rectangular ring having sufficient size to circumscribe the IC die 106. It is contemplated the stiffener 160 may have any shape suitable for circumscribing the IC die 106. The stiffener 160 extends to the peripheral edges of the package substrate 108 to provide mechanical support that enhances the warpage resistance of the package substrate 108, and ultimately the chip package 100. In this respect, the stiffener 160 is similar in size and shape to the package substrate 108, although the stiffener 160 may be slightly smaller or larger than the package substrate 108. In some embodiments, the stiffener 160 is secured to the package substrate 108 using an adhesive, such as epoxy.

The stiffener 160 includes a ring body 168 and a plurality of support members 170 positioned around the perimeter of the ring body 168. The ring body 168 has a ring shape defined by two long peripheral edges 181 and two short peripheral edges 182. In other examples, the ring body 168 may have peripheral edges of the same or different lengths. For example, the ring body 168 may be square, rectangular, or have an irregular polygonal shape. The support members 170 may be attached to the ring body 168 or integral with the ring body 168. In one example, the support members 170 are positioned proximate the corners 183 of the stiffener 160. As shown, the support members 170 are positioned along the long peripheral edges 181 and near the corners 183 of the stiffener 160. In some embodiments, the support members 170 are positioned at a location that is within 25% of the distance of a peripheral edge 181, 182 of the ring body 168 from a corner 183 of the package substrate 108. In some embodiments, one or more of the support members 170 or additional support members 170 may be positioned along the long and/or short peripheral edges 181, 182 of the stiffener 160. In some embodiments, one or more support members 170 are positioned at a location along any portion of the peripheral edges 181, 182 of the stiffener 160. For example, three support members 170 may be equally spaced apart along each of the long peripheral edges 181 of the stiffener 160.

The support members 170 extend below the stiffener 160 and the bottom surface 137 of the package substrate 108 to engage the PCB 116. As shown in FIG. 3A, the support members 170 extend below the package substrate 108 and the solder joint 122 before engaging the PCB 116. In one example, the support members 170 are located outward of the ring body 168 so they can pass outward of the package substrate 108 while the ring body 168 is seated on the top surface 136 of the package substrate 108.

The support members 170 have a lower end configured for engagement with the PCB 116. In one example, the lower end of the support members 170 include a shoulder portion 174 and an extension portion 172 below the shoulder portion 174. As shown, the support members 170 have a "T" shaped lower end, but may have an "L" shape or other suitable shapes for engagement with the PCB 116. For example, the support members 170 may have a plurality of extension portions 172 below the shoulder portion 174. In the example depicted in FIG. 3A, the extension portion 172 is inserted into the PCB 116, and the shoulder portion 174 of the lower end acts as an end stop on the top surface 119 of the PCB 116. In one example, the support members 170 are inserted into an aperture 190, such as a slot, formed in the PCB 116, as shown in FIGS. 1 and 3A. In this example, the aperture 190 extends through the PCB 116, but in some examples, the aperture 190 may extend partially into the PCB 116. Also, the extension portion 172 extends through the aperture 190, but in some examples, may extend partially into the aperture 190. The shoulder portion 174 is larger than the aperture 190 such that the shoulder portion 174 rests on the top surface 119 of the PCB 116. Although FIG. 3A shows the support members 170 as having a generally planar shape, the support members 170 may have other suitable shapes such as a cylindrical shape with a skinnier lower end. In some embodiments, the lower end of the support members 170 may attach to the top surface 119 of the PCB 116, e.g., surface mounted.

Figure 4:
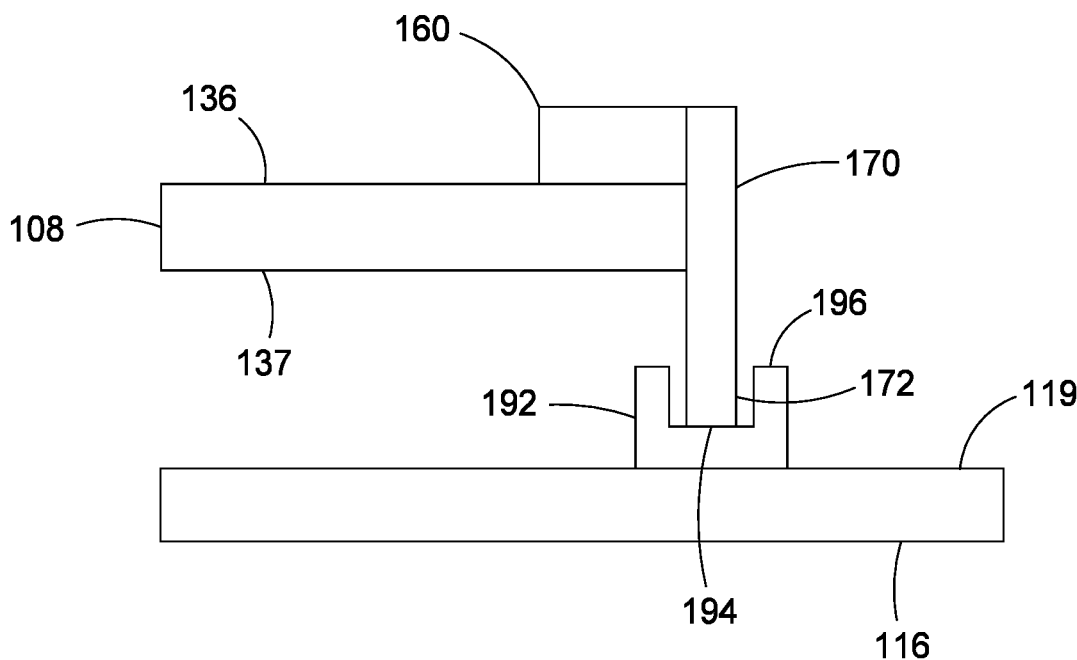
FIG. 4 partial schematic side view of another electronic device having a stiffener of a chip package engaged with a surface mounted receptacle disposed on a printed circuit board, according to some embodiments.

In another example, the support members 170 are inserted into a surface mounted receptacle 192 disposed on the PCB 116, as shown in FIG. 4. As shown, the stiffener 160 is attached to the top surface 136 of the package substrate 108. The support members 170 extend below the bottom surface 137 of the package substrate 108 and engage the surface mounted receptacle 192. The surface mounted receptacle 192 is attached to the top surface 119 of the PCB 116. In one example, the lower end of the support members 170 is inserted into an aperture 194 in the surface mounted receptacle 192. In some embodiments, the lower end of the support members 170 includes a shoulder portion 174 and an extension portion 172 below the shoulder portion 174. The extension portion 172 may be inserted into the aperture 194, while the shoulder portion 174 rests on the top surface 196 of the surface mounted receptacle.

In some embodiments, the support members 170 are secured to the PCB 116. For example, the extension portion 172 is inserted into the aperture 190 or the aperture 194, and the support members 170 are soldered or bonded to the PCB 116. In some examples, the support members 170 are soldered to the PCB 116 during a reflow process that creates the solder joint 122 between the package substrate 108 and the PCB 116. FIG. 1 shows an exemplary solder joint 177 attaching the support members 170 to the PCB 116. In another example, the support members 170 are attached to the PCB 116 using an adhesive, such as an epoxy. In other examples, the support members 170 are attached to the aperture 190 in the PCB 116 using an interference fit or a suitable fastener.

In some embodiments, the support members 170 are configured to provide a suitable spacing between the package substrate 108 and the PCB 116. As shown in FIG. 3A, the support members 170 are configured to provide a height "a" between the top surface of the stiffener 160 and the top surface 119 of the PCB 116. In some embodiments, the height "a" is determined by the distance between the top surface of the stiffener 160 to the bottom surface of the shoulder portion 174, which rests on the top surface 119 of the PCB 116. The presence of spacing height "a" advantageously provides constant spacing between the package substrate 108 and the PCB 116. Spacing height "a" may also beneficially provide control of the solder joint 122 height between the package substrate 108 and the PCB 116.

FIG. 5 illustrates a flow diagram for fabricating an electronic device, such as electronic device 105. At operation 510, an IC die 106 is mounted on a top surface 136 of a package substrate 108. Mounting of the IC die 106 on the package substrate 108 includes making electrical connections between the circuitry of the IC die 106 and the package substrate 108, for example, through solder or other electromechanical connections.

At operation 520, a stiffener 160 is secured to the top surface of the package substrate 108. The stiffener 160 includes a plurality of support members 170 extending below the bottom surface of the package substrate 108. The stiffener 160 may be secured to the package substrate 108 using an adhesive.

At operation 530, the lower end of the plurality of support members 170 is coupled a PCB 116. In one example, the lower end of the plurality of support members 170 is disposed in an aperture 190 formed in the PCB 116. In another example, the lower end of the plurality of support members 170 is inserted into a surface mounted receptacle 192 attached to the top surface of the PCB 116. In some embodiments, operation 530 may be performed before operation 520 or operation 510.

At operation 540, the support members 170 are soldered to the PCB 116 during a reflow process that creates the solder joint 122 between the package substrate 108 and the PCB 116. FIG. 1 shows an exemplary solder joint 177 attaching the support members 170 to the PCB 116.

In one embodiment, an electronic device includes a package substrate having a top surface and a bottom surface. An integrated circuit ("IC") die is disposed on the top surface of the package substrate. The electronic device also includes a stiffener having a ring body and a plurality of support members. The ring body is secured to the top surface of the package substrate and circumscribes the IC die. The plurality of support members extend from the ring body to below the bottom surface of the package substrate.

In another embodiment, an electronic device includes a package substrate having a top surface and a bottom surface. An integrated circuit ("IC") die is disposed on the top surface of the package substrate. A stiffener is secured to the top surface of the package substrate and circumscribes the IC die. The stiffener has a plurality of support members extending below the bottom surface of the package substrate. A printed circuit board ("PCB") is connected to the package substrate. The plurality of support members are configured to provide constant spacing between the package substrate and the PCB.

In another embodiment, a method of fabricating an electronic device includes mounting an integrated circuit (IC) die to a top surface of a package substrate. A stiffener securing to the package substrate. The stiffener includes a plurality of support members extending below a bottom surface of the package substrate. A lower end of the plurality of support members is coupled to a PCB. Thereafter, the lower end of the support members is soldered to the PCB during a reflow process that creates a solder joint between the package substrate and the PCB.

While the foregoing is directed to embodiments of the present invention, other and further embodiments of the invention may be devised without departing from the basic scope thereof, and the scope thereof is determined by the claims that follow.

What is claimed is:

1. An electronic device, comprising:
a package substrate having a top surface and a bottom surface;
a plurality of solder balls disposed on the bottom surface of the package substrate;
an integrated circuit ("IC") die disposed on the top surface of the package substrate; and
a stiffener having a ring body and a plurality of support members, the ring body secured to the top surface of the package substrate and circumscribing the IC die, the plurality of support members extending from the ring body below the plurality of solder balls disposed on the bottom surface of the package substrate.

2. The electronic device of claim 1, wherein the ring body comprises a rectangular shape defined by two long peripheral edges and two short peripheral edges.

3. The electronic device of claim 2, wherein the plurality of support members are positioned along the two long peripheral edges.

4. The electronic device of claim 2, wherein the plurality of support members are positioned at a location that is within 25% of a distance of one of the long or short peripheral edges from a corner of the ring body.

5. The electronic device of claim 1, wherein the ring body extends to a peripheral edge of the package substrate.

6. The electronic device of claim 1, wherein a lower end of the plurality of support members includes a shoulder portion and an extension portion below the shoulder portion.

7. The electronic device of claim 6, wherein a distance from the top surface of the package substrate to the shoulder portion of each of the plurality of support members is the same.

8. The electronic device of claim 1, further comprising a printed circuit board ("PCB") positioned below the package substrate, wherein a lower end of the stiffener is attached to the PCB.

9. An electronic device, comprising:
a package substrate having a top surface and a bottom surface;
a plurality of solder balls disposed on the bottom surface of the package substrate;
an integrated circuit ("IC") die disposed on the top surface of the package substrate;
a stiffener disposed on the package substrate and circumscribing the IC die, the stiffener having a plurality of support members extending below the plurality of solder balls disposed on the package substrate; and
a printed circuit board ("PCB") connected to the package substrate by the plurality of solder balls, wherein the plurality of support members are configured to provide constant spacing between the package substrate and the PCB.

10. The electronic device of claim 9, wherein a lower end of the plurality of support members is attached to the PCB.

11. The electronic device of claim 10, wherein the lower end of the plurality of support members includes an extension portion disposed below a top surface of the PCB.

12. The electronic device of claim 11, wherein the extension portion is disposed in an aperture formed in the PCB.

13. The electronic device of claim 12, wherein the lower end of the plurality of support members includes a shoulder portion contacting the top surface of the PCB.

14. The electronic device of claim 9, wherein the plurality of support members are soldered to the PCB.

15. The electronic device of claim 14, further comprising a plurality of solder joints connecting the package substrate to the PCB.

16. The electronic device of claim 9, wherein the stiffener comprises a rectangular shape defined by two long peripheral edges and two short peripheral edges, and wherein the plurality of support members are positioned at a location that is within 25% of a distance of one of the long or short peripheral edges from a corner of the stiffener.

17. An electronic device, comprising:
a package substrate having a top surface and a bottom surface;
a plurality of solder balls disposed on the bottom surface of the package substrate;
an integrated circuit ("IC") die disposed on the top surface of the package substrate;
a stiffener disposed on the package substrate and circumscribing the IC die, the stiffener having a plurality of support members extending below the package substrate; and
a printed circuit board ("PCB") connected to the package substrate by the plurality of solder balls;
a surface mounted receptacle attached to a top surface of the PCB, wherein a lower end of one of the plurality of support members is attached to the surface mounted receptacle.

* * * * *